United States Patent [19]
Koenigkramer et al.

[11] Patent Number: 5,928,834
[45] Date of Patent: Jul. 27, 1999

[54] SPOT GLOSS FILM FOR COLOR IMAGES

[75] Inventors: Rusty Koenigkramer, Neshanic Station; Wojciech Wilczak, Jersey City, both of N.J.

[73] Assignee: Agfa Corporation, Ridgefield Park, N.J.

[21] Appl. No.: 09/044,732

[22] Filed: Mar. 19, 1998

[51] Int. Cl.⁶ .................................................. G03C 1/805
[52] U.S. Cl. .......................... 430/259; 430/260; 430/263; 430/253; 430/256
[58] Field of Search .................................... 430/253, 256, 430/259, 260, 263

[56] References Cited

U.S. PATENT DOCUMENTS

| | | | |
|---|---|---|---|
| 5,300,399 | 4/1994 | Wilczak | 430/253 |
| 5,534,384 | 7/1996 | Platzer et al. | 430/260 |
| 5,738,970 | 4/1998 | Hsieh et al. | 430/259 |

*Primary Examiner*—Janet Baxter
*Assistant Examiner*—Yvette M. Clarke
*Attorney, Agent, or Firm*—Roberts & Mercanti, L.L.P.

[57] ABSTRACT

A spot gloss film element for color systems which provides a glossy sheen to image-bearing receiver sheets in areas which were exposed to actinic radiation, while the unexposed areas remain partially or completely matte. The film element comprises, sequentially, a strippable, transparent cover sheet; a crosslinked phenolic layer; a gloss layer, which comprises an organic binder, a polymerizable component, a particulate material, and an optional photoinitiator; a photoadhering layer, which comprises a polymerizable component, a binder, and an optional photoinitiator; and a thermoplastic adhesive layer. The spot gloss film is laminated to an image bearing receiver sheet. The gloss layer and the photoadhering layer are exposed to actinic radiation through the transparent cover sheet and crosslinked phenolic layer. After peeling apart the image bearing receiver sheet and the transparent cover sheet, the crosslinked phenolic layer and the unexposed areas of the gloss layer are attached to the cover sheet, while the exposed areas of the gloss layer and the unexposed areas of the photoadhering layer remain attached to the image bearing receiver sheet.

26 Claims, No Drawings

SPOT GLOSS FILM FOR COLOR IMAGES

BACKGROUND OF THE INVENTION

1. Field of the Invention

The present invention relates to color proofing films. More particularly, the invention relates to a novel spot gloss layer for color proofing film systems. Such films permit the selective application of a gloss to a color proofing film image.

2. Description of the Prior Art

In the field of lithographic printing, it is desirable to produce a multicolor proof to assist in correcting a set of color separation films prior to using them to produce metal based lithographic printing plates. The proof should reproduce the color quality that will ultimately be obtained during the printing process. The proof must be a consistent duplicate of the desired halftone image. Visual examination of a color proof should show the color rendition to be expected from a press printing using the color separations, and any defects on the separations which might need to be altered before making the printing plates. There are two general types of photoimaging methods, namely the overlay type and the single sheet type.

In the overlay type of color proofing method, an independent transparent plastic support is used for producing an image of each color separation film by applying a photosensitive solution of the corresponding color. The supports carrying images of the corresponding colors are then superimposed upon each other over a white sheet to produce a color proofing composite. Examples of such overlay approaches are contained in U.S. Pat. Nos. 3,136,637; 3,211,553; and 3,326,682.

In the single sheet type of color proofing, a color proofing sheet is prepared by successively producing images of different colors from different color separation films on a single receiver sheet. This can be accomplished by sequentially applying colorants or colored, photosensitive layers to a single opaque support. Examples of such single sheet approaches are contained in U.S. Pat. Nos. 3,574,049; 3,671,236; 4,260,673; 4,366,223; 4,650,738; 4,656,114; and 4,659,642. Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264. Peel apart color proofing systems are also well known. U.S. Pat. Nos. 4,963,462; 5,049,476; 4,910,120 and 5,108,868, which are incorporated herein by reference, disclose peel developable, single sheet color proofing systems. U.S. Pat. No. 4,489,154, discloses a process which produces a single layer color proof by peel development. U.S. Pat. No. 5,300,399, which is incorporated herein by reference, discloses a peel apart color proofing system to produce a negative-acting color proofing film.

In the production of such color proofing films, it would be desirable to apply a glossy finish to selected portions of the image. It would be further desirable to apply a matte finish to an image and to achieve a double effect where certain areas of the receiver sheet are made glossy, while other areas are either not made glossy or are actually made partially or completely matte. It has now been unexpectedly found that by applying a gloss layer to an image bearing substrate using the peel-apart photographic element of the present invention, a gloss layer is applied to selected areas of the image, that is, a gloss remains where the gloss layer has been exposed to actinic radiation and transferred onto the image, while the image portions corresponding to the unexposed, removed areas of the gloss layer remain non-glossy or are made partially or completely matte. The gloss layer of the present invention comprises a translucent, photosensitive composition having imbedded particulate matter therein. When imagewise transferred to the surface of the image, a glossy sheen is applied to desired portions of the image. Optionally, the imbedded particles can cause the non-image areas of the gloss layer to emboss the balance of the image, resulting in a matte surface to the balance of the image.

SUMMARY OF THE INVENTION

This invention provides a spot gloss film which comprises, in order from top to bottom:

(i) a strippable, transparent cover sheet;

(ii) a crosslinked layer, which comprises a polymer having phenolic groups;

(iii) a translucent gloss layer, which comprises an organic binder, a polymerizable component comprising an ethylenically unsaturated monomer, polymer or oligomer having at least one unsaturated group, a particulate material, and optionally, a photoinitiator, wherein the binder is present in sufficient amount to bind the gloss layer components into a uniform film, wherein the optional photoinitiator, when present, is present in sufficient amount to initiate polymerization of the polymerizable component, wherein the polymerizable component is present in sufficient amount to provide image differentiation when the film is imagewise exposed to actinic radiation, and wherein the particulate material is present in an amount sufficient to form a uniform suspension of the particulate material in the gloss layer;

(iv) a photoadhering layer, which comprises a polymerizable component comprising an ethylenically unsaturated monomer, polymer or oligomer having at least one unsaturated group; a binder; and an optional photoinitiator, wherein the optional photoinitiator, when present, is present in sufficient amount to initiate polymerization of the polymerizable component; and wherein at least one of the gloss layer and the photoadhering layer contains a photoinitiator; and (v) a thermoplastic adhesive layer.

This invention also provides a method for producing a gloss-coated colored image which comprises:

A) providing a spot gloss film which comprises, in order from top to bottom:

(i) a strippable, transparent cover sheet;

(ii) a crosslinked layer, which comprises a polymer having phenolic groups;

(iii) a translucent gloss layer, which comprises an organic binder, a polymerizable component comprising an ethylenically unsaturated monomer, polymer or oligomer having at least one unsaturated group, a particulate material, and optionally, a photoinitiator, wherein the binder is present in sufficient amount to bind the gloss layer components into a uniform film, wherein the optional photoinitiator, when present, is present in sufficient amount to initiate polymerization of the polymerizable component, wherein the polymerizable component is present in sufficient amount to provide image differentiation when the film is imagewise exposed to actinic radiation, and wherein the particulate material is present in an amount sufficient to form a uniform suspension of the particulate material in the gloss layer;

(iv) a photoadhering layer, which comprises a polymerizable component comprising an ethylenically unsaturated monomer, polymer or oligomer having at least one unsaturated group; a binder; and an optional photoinitiator, wherein the optional photoinitiator, when present, is present in sufficient amount to initiate polymerization of the polymerizable component; and wherein at least one of the gloss layer and the photoadhering layer contains a photoinitiator; and (v) a thermoplastic adhesive layer;

B) laminating the spot gloss film to an image bearing receiver sheet;

C) imagewise exposing the gloss layer and the photoadhering layer to actinic radiation through the transparent cover sheet and crosslinked phenolic layer; and D) peeling apart the image bearing receiver sheet and the transparent cover sheet, thereby leaving the crosslinked phenolic layer and the unexposed areas of the gloss layer attached to the cover sheet, while the exposed areas of the gloss layer and the unexposed areas of the photoadhering layer and the adhesive layer remain attached to the image bearing receiver sheet.

This invention further provides a method for producing a gloss film which comprises:

(i) applying a crosslinked layer which comprises a polymer having phenolic groups, to a surface of a strippable, transparent cover sheet;

(ii) applying a translucent gloss layer onto the crosslinked layer, which gloss layer comprises an organic binder, a polymerizable component comprising an ethylenically unsaturated monomer, polymer or oligomer having at least one unsaturated group, a particulate material, and optionally, a photoinitiator, wherein the binder is present in sufficient amount to bind the gloss layer components into a uniform film, wherein the optional photoinitiator, when present, is present in sufficient amount to initiate polymerization of the polymerizable component, wherein the polymerizable component is present in sufficient amount to provide image differentiation when the film is imagewise exposed to actinic radiation, and wherein the particulate material is present in an amount sufficient to form a uniform suspension of the particulate material in the gloss layer;

(iii) applying a photoadhering layer onto the gloss layer, which photoadhering layer comprises a polymerizable component comprising an ethylenically unsaturated monomer, polymer or oligomer having at least one unsaturated group; a binder and a photoinitiator, wherein the photoinitiator is present in sufficient amount to initiate polymerization of the polymerizable component; and causing the polymerizable component and photoinitiator to diffuse into the gloss layer; and (iv) applying a thermoplastic adhesive layer onto the photoadhering layer.

DETAILED DESCRIPTION OF THE PREFERRED EMBODIMENT

The present invention pertains to a spot gloss film. For the purposes of this invention, a spot gloss film is a film which is capable of applying a glossy surface to selected portions of an image containing substrate.

In general, the spot gloss film of the invention is prepared by forming a series of layers on a strippable transparent cover sheet. These layers sequentially comprise a crosslinked phenolic layer, a gloss layer, a photoadherent layer and a thermoplastic adhesive layer.

In the preferred embodiment, the cover sheet may comprise any suitable flexible sheet material, provided it is transparent to the actinic radiation to which both the gloss layer and photoadhering layer are sensitive. In the preferred embodiment, the cover sheet has a surface which is dimensionally stable, and should have substantially no change in dimensions under heating in the range of approximately 60° C. to 120° C. during lamination. One preferred cover sheet material is polyethylene terephthalate (PET). In the preferred embodiment, the cover sheet has a thickness of from about 1 to about 10 mils, a more preferred thickness of from about 2 to about 5 mils and a most preferred thickness from about 2 to about 3 mils. Suitable films nonexclusively include MELINEX® 054, 504, 505, and 582 films available from ICI, and HOSTAPHAN® 4400, 4500, and 4540 films available from Hoechst Celanese Corporation. The surface of the support may be smooth or it may be provided with a matte texture as with MELINEX® 475 film. A smooth surface is preferred because a rough surface scatters actinic radiation and thereby reduces the resolution capability of the photosensitive element.

On the cover sheet is a crosslinked layer, which comprises a polymer having phenolic groups. The phenolic polymer can comprise, for example, a novolak (cresol-formaldehyde resin), polyhydroxystyrene homo- and co-polymer, or acrylic polymer containing phenolic groups, etc. Crosslinking of the polymer can be achieved by the use of polyisocyanates, melamine-formaldehyde resins, urea-formaldehyde resins, epoxy resins, aziridine resins, acrylic monomers under suitable conditions of heat and/or light, etc. The crosslinked phenolic layer is applied from a solvent coating composition onto the cover sheet and should be insoluble in solvents used to coat the subsequent layer. Useful solvents include organic solvents as well as water.

A gloss layer is then applied to the crosslinked phenolic layer. It comprises a particulate material, a binder, a photoinitiator, and a polymerizable component which may be an ethylenically unsaturated monomer, polymer or oligomer having at least one and preferably more than one unsaturated groups. The gloss layer may be formed from a composition containing all of these components, or more preferably, the gloss layer is formed by coating an admixture of a binder and particulate material onto the phenolic layer, and the photoinitiator and polymerizable component diffuse into the gloss layer from a subsequently applied photoadherent layer.

The polymerizable component in the gloss layer and in the photoadhering layer preferably comprise addition polymerizable, non-gaseous (boiling temperature above 100° C. at normal atmospheric pressure), ethylenically unsaturated compounds containing at least one and preferably at least two terminal ethylenically unsaturated groups, and being capable of forming a high molecular weight polymer by free radical initiated, chain propagating addition polymerization. The most preferred compounds are acrylate or methacrylate monomers as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, and bisphenol A diepoxide dimethacrylate. The polymerizable component in the gloss and photoadhering layers can be the same or different.

Free radical liberating photoinitiators used in the gloss layer and/or photoadhering layer include any compounds which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. Nos. 3,987,037 and 4,189,323. The most preferred photoinitiators include 2,3-di(4-methoxyphenyl)quinoxaline, 9-phenylacridine, 2-biphenyl-4,6-bis-trichloromethyl-5-triazine, bis(2,4,5-triphenyl)imidazole, bis-trichloromethyl-s-triazines, thioxanthones, acetophenones and acyl phosphine oxides, and the derivatives of each of these. For this invention, the term derivatives means that the compound may have pendant groups provided they do not prevent the compound from effecting photoinitiation. The photoinitiator used in the gloss and/or photoadhering layer may be the same or different.

The gloss layer also contains a binding resin which not only determines the hardness and/or flexibility of the coating but is also used to control the dry development. Binding resins found suitable for the glass layer are polyvinyl acetates, styrene/maleic anhydride copolymers and their half esters; acrylic polymers and copolymers; polyamides; polyvinyl pyrrolidones; cellulose and its derivatives; phenolic resins; and the like. The most preferred binding resins are polyvinyl acetates and acetals, such as UCAR resins available from Union Carbide, and polyvinyl formal, polyvinyl butyral and polyvinyl propional.

The particulate material in the gloss layer may comprise any material in the form of small particles such as plastic beads and hollow spheres which causes the gloss layer to be translucent. Non-exclusive examples of particulate materials useful for the invention are silica, polymethyl methacrylate, polyvinyl formal and styrene acrylate copolymers. Particularly useful are the polymethyl methacrylates desribed in U.S. Pat. No. 4,855,225. The average diameter of these particles preferably ranges from about 0.1 $\mu$m to about 1.0 $\mu$m, more preferably from about 0.2 $\mu$m to about 0.8 $\mu$m, most preferably from about 0.3 $\mu$m to about 0.6 $\mu$m. The particulate material is present in a suspension of the gloss layer components.

In the practice of the present invention, the photoinitiator component is preferably present in the gloss layer in an amount ranging from about 0.01% to about 20% based on the weight of the solids in the layer. A more preferred range is from about 0.1% to about 15%, and most preferably from about 1% to about 10% by weight of the gloss layer composition. In a preferred embodiment, the binder component is present in the gloss layer in an amount sufficient to bind the components in a uniform mixture and a uniform film when it is coated on a substrate. It is preferably present in an amount ranging from about 10% to about 90% based on the weight of the solids in the gloss layer. A more preferred range is from about 20 to about 80%. In the preferred embodiments, the polymerizable component is present in the gloss layer in an amount of from about 1% to about 60% by weight of the total solids in the gloss layer, more preferably from about 5% to about 50%. The particulate material component is preferably present in an amount sufficient to form a substantially uniform suspension of the gloss layer components, while also causing the gloss layer to be translucent. It is preferably present in an amount of from about 0.1% to about 20%, more preferably from about 1% to about 15%, and most preferably from about 5% to about 10% by weight of the gloss layer composition.

Other ingredients which may optionally be present in the gloss layer include thermal polymerization inhibitors, tackifiers, oligomers, residual solvents, surfactants, inert fillers, antihalation agents, hydrogen atom donors, photoactivators, and optical brightening agents. A plasticizer may also be included in the gloss layer and/or photoadhering layer of this invention to prevent coating brittleness and to keep the composition pliable if desired. Suitable plasticizers include dibutylphthalate, triarylphosphate and substituted analogs thereof and preferably dioctylphthalate. The gloss layer is applied from a solvent coating composition to the crosslinked phenolic layer and dried. Organic solvents are preferred for the gloss layer because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, diacetone alcohol, and gamma-butyrolactone. In the preferred embodiment the gloss layer has a coating weight range of from about 0.1 to about 5 $g/m^2$, preferably from about 0.2 to about 2 $g/m^2$ and the crosslinked phenolic layer has a coating weight range of from about 0.1 to about 5 $g/m^2$, preferably from about 0.4 to 2.0 $g/m^2$.

Adhered to the gloss layer is the photoadhering layer. The photoadhering layer comprises a binder; an optional photoinitiator; a polymerizable component comprising an ethylenically unsaturated monomer, polymer or oligomer having at least one unsaturated group; and optionally a polymer comprising polyvinyl acetal and polyvinyl alcohol segments, having from about 1 to about 40 weight % polyvinyl alcohol content.

Binders which may be used for the photoadhering layer include any of the binders listed above as useful for the gloss layer. The amounts of binder which may be used in the photoadhering layer are the amounts listed above as useful for the gloss layer.

The optional photoinitiator for the photoadhering layer may comprise any of the photoinitiators described above as useful for the gloss layer. In the practice of the present invention, the photoinitiator component is preferably present in the photoadhering layer in an amount ranging from about 1% to about 20% based on the weight of the solids in the layer. A more preferred range is from about 2% to about 15%, most preferably from about 3% to about 10%. Importantly, a photoinitiator must be present in at least one of the gloss layer and the photoadhering layer.

The polymerizable component comprising an ethylenically unsaturated monomer, polymer or oligomer having at least one unsaturated group may comprise the same materials listed above as useful for the gloss layer. The polymerizable component is preferably present in the photoadhering layer in an amount ranging from about 5% to about 50% based on the weight of the solids in the layer. A more preferred range is from about 10% to about 45%, most preferably from about 15% to about 40%.

The optional polyvinyl acetal component, when one is used, is preferably present in the photoadhering layer in an amount of from about 5% to about 85%, more preferably from about 20% to about 70%, and most preferably from about 30% to about 65% by weight of the total solids in the photoadhering layer. Polymers comprising vinyl acetal and vinyl alcohol segments are present in an amount from about 1% to about 40% by weight of the vinyl alcohol content, more preferably from about 3% to about 30%, and most preferably from about 5% to about 25%. Suitable polymers non-exclusively include polyvinyl butyrals and propional such as BUTVARS® 79, 76, 90, 98 72, 73 and 74 from Monsanto, MOWITALS® B30HH, B60HH available from Hoechst AG and the resins described in U.S. Pat. No. 4,665,124, which is incorporated herein by reference.

The photoadherent layer optionally, but preferably, also comprises a photopolymerizable polymer. Suitable photopolymerizable polymers nonexclusively include a urethane adduct of polyvinyl butyral or other acetal resins containing hydroxy groups and isocyanatoethyl methacrylate, or reaction product of hydroxy-containing acetal resins with methacrylic anhydride, acrylic acid, acryloyl chloride, etc. Such a polymer has ethylenically unsaturated, photocrosslinkable groups and a molecular weight greater than about 3,000 and preferably from about 50,000 to about 200,000. Preferred photopolymerizable polymers comprise random units of a)

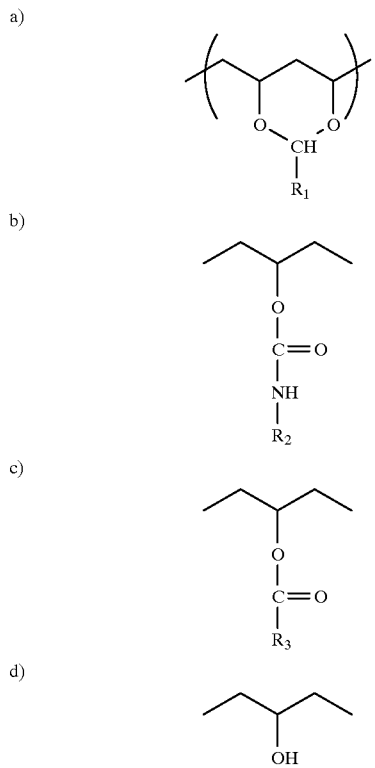

b)

c)

d)

wherein
a=50–99%
b=1=30%
c=0–30%
d=0–50% and a+b+c+d=100%

$R_1$ is a hydrogen atom or a substituted or unsubstituted alkyl radical having from 1 to about 6 carbon atoms, or a substituted or unsubstituted aryl radical;

$R_2$ is

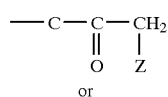

or

-continued

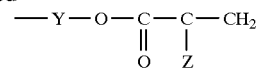

wherein Z is hydrogen or methyl and Y is a substituted or unsubstituted alkyl group having from 1 to about 4 carbon atoms; and $R_3$ is an alkyl radical having from 1 to about 4 carbon atoms. As used herein the term "substituted" means having a pendant group which does not detrimentally affect the photosensitive property of the polymer.

A preferred photopolymerizable polymer is the reaction product of a polyvinyl acetal such as a polyvinyl butyral with a (meth)acrylated monoisocyanate such as acryloyl isocyanate, methacryloyl isocyanate or isocyanatoethyl methacrylate. Such a reaction may take place in an organic solvent unreactive with the isocyanate, such as tetrahydrofurane, methyl ethyl ketone or ethyl acetate. The reaction may optionally be catalyzed by such known catalysts as dibutyltin dilaureate. Acrylic polymers containing hydroxy groups can also be used with all the above (meth) acrylic groups-containing reagents, as can polyvinyl alcohols and their copolymers, phenolic resins, etc. Other reactive groups on polymers which can be (meth)acrylated nonexclusively include: amino, carboxyl, epoxy, etc. The (meth)acrylated polyvinyl acetal polymers are preferred. The photopolymerizable polymer component is preferably present in the photoadhering layer in an amount of from about 3% to about 50% by weight of the total solids in the photoadhering layer, more preferably from about 5% to about 40% and most preferably from about 10% to about 30%.

The photoadherent layer may optionally contain such other desired components as UV absorbers such as UVINUL® D-50 available from GAF, antistatic compositions such as GAFAC® and GAFSTAT® available from GAF, optical brighteners, inert fillers, thermal polymerizable inhibitors, residual solvents, surfactants, antihalation agents, hydrogen atom donors, tackifiers, and plasticizers such as RESOFLEX® R-296, available from Cambridge Industries.

To form the photoadhering layer, the components may be dissolved in a solvent or mixture of solvents to facilitate application of the composition to the substrate. Suitable solvents for this purpose nonexclusively include water, tetrahydrofuran, n-butyl acetate, isobutyl isobutyrate, glycol ethers such as propylene glycol monomethyl ether and methyl cellosolve, alcohols such as ethanol and n-propanol and ketones such as methyl ethyl ketone. In general, the solvent composition is evaporated from the coating composition once it is applied to an appropriate substrate. However, some insignificant amount of solvent may remain as residue. In addition, the polymerizable monomer from the photoadhering layer tends to diffuse into the gloss layer during overcoating process, so one way of providing the gloss layer with the polymerizable monomer is not to include it in the coating solution of the gloss layer, but let it migrate there from the photoadhering layer during coating and drying process, or during lamination of the layers. This process of monomer migration via diffusion is known to those skilled in the art of creating multilayer imaging systems. According to the present invention, it is important that the polymerizable monomer be present in the gloss layer when the element is exposed to actinic radiation, regardless of the way it became the part of the gloss layer. In the preferred embodiment, the photoadhering layer has a coating weight of from about 2 g/m² to about 20 g/m². The most preferred weight is from about 3 g/m² to about 10 g/m².

The element next comprises a thermoplastic adhesive layer coated directly on the photoadhering layer. Preferred adhesive layers comprise thermoplastic resins coatable out of water. Such nonexclusively include Carboset acrylic resins, polyvinyl acetate/crotonic acid copolymers, polyvinyl pyrrolidone/polyvinyl acetate copolymers, polyvinyl acetate emulsions, styrene/maleic anhydride copolymers, urethane polymers, etc. The adhesive layer should be coated from a solvent which does not disturb the photoadhering layer underneath. Water is the preferred solvent. The adhesive layer may comprise a plasticizer which may be present in an amount of up to about 10% by weight and a uv absorber in an amount of up to about 10% by weight. The coating weight of the layer should be from about 2 $g/m^2$ to about 20 $g/m^2$, more preferably from about 5 $g/m^2$ to about 15 $g/m^2$, and most preferably from about 6 $g/m^2$ to about 10 $g/m^2$. In place of direct overcoating, one can assemble the hereinbefore described photosensitive element by hot-laminating the layers to each other, as is well known in the art. The adhesive layer should be transferable to an image bearing receiver sheet when laminated with pressure and heat in a temperature range of from about 50° C. to about 180° C., more preferably from about 60° C. to 120° C., and most preferably from about 60° C. to about 100° C.

Receiver sheets may comprise virtually any material which can withstand the laminating and dry development processes. White plastic sheets, such as adhesion pretreated polyester MELINEX® 3020 film available from ICI, are useful for this purpose. Plastic coated paper sheets, such as polyethylene coated paper available from Schoeller, may also be used. Other bases may include wood, glass, metal, paper and the like. An image on the receiver sheet may be formed by any means known in the art. Such may include images formed on the receiver sheet by any of the color proofing methods indicated in the U.S. patents listed above.

In use, the spot gloss film according to the present invention is laminated to the image bearing receiver sheet by placing the adhesive layer in contact with the image on the receiver sheet and then introducing the materials into the nip of a pair of heated laminating rollers under suitable pressure. Suitable laminating temperatures usually range from approximately 60° C. to 120° C., preferably from 70° C. to 100° C. The spot gloss film element is then exposed by means well known in the art. Such exposure may be conducted by exposure to actinic radiation from a light source through a conventional halftone negative color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After exposure, a negative spot gloss image is anchored via the photoadhering layer and adhesive layer on the image bearing receiver sheet by stripping the transparent cover sheet from the receiver sheet at room temperature with a steady, continuous motion. The preferred peel angle relative to the peel direction is greater than 90°. The delamination leaves the photoexposed areas of the gloss layer attached to the photoadhering layer, which in its entirety is attached to the receiver sheet via the adhesive layer on the receiver sheet. The nonexposed areas of the gloss layer remain on the phenolic layer on the cover sheet which has been peeled apart from the receiver sheet. Thus, a spot gloss remains on the receiver sheet image. That is, a glossy coating is transferred onto selected, imagewise exposed, portions of the proof after peel-apart. Thus, part of the proof is thus glossy, and part is non-glossy. Depending on the selection of gloss layer components and exposure conditions, the removed portions of the gloss layer may emboss the photoadherent layer which has been transferred in full onto the proof image. This embossing gives the balance of the proof, i.e. the portion underlying the non-exposed areas of the gloss layer, a hazy or matte appearance. The degree of matte-ness may be easily determined and controlled by the skilled artisan. The final four-color proof may be given a uniform, blanket exposure to photoharden the gloss and photoadherent layers.

The following non-limiting examples serve to illustrate the invention.

EXAMPLE 1

A negative-working multilayer spot gloss element was prepared as follows:

On a 2 mil sheet of PET the following solution was coated with the aid of #12 Meyer rod:

1. Methyl ethyl ketone-47 g
2. Methoxy propanol-47 g
3. Poly-p-hydroxy styrene (12,000 MW, Maruzen)-10 g
4. Melamine-formaldehyde resin (CYMEL® 303, Cytec)-2 g
5. p-Toluenesulfonic acid-1 g.

The layer was crosslinked in the oven at 100° C. for 2 minutes. The dry weight was 1 $g/m^2$.

On this crosslinked layer, a spot gloss solution was coated with the aid of #12 Meyer rod:

1. Methoxy propanol-53 g
2. Methyl ethyl ketone-13 g
3. Diacetone alcohol-20 g
4. FORMVAR® 12/85 polyvinyl formal resin, Monsanto-3.0 g
5. Silica particles (SYLOID® 7000, WR Grace)-0.2 g The gloss layer was dried in the oven at 100° C. for 1 minute.

On this gloss layer, a photoadhering layer solution was coated with the aid of #24 Meyer rod:

1. n-Butyl acetate-50 g
2. Polymer containing methacrylate groups (U.S. Pat. No. 5,300,399, Example 1)-10 g
3. Dipentaerythritol pentaacrylate (SARTOMER® 399, Sartomer Co)-4 g
4. 2-biphenylyl-4,6-bis-trichloromethyl-s-triazine-0.6 g The layer had 4 $g/m^2$ dry thickness.

On this photoadhering layer, an adhesive solution was coated with the aid of #20 Meyer rod:

1. Water-44 g
2. Acrylic resin (CARBOSET® 511, BF Goodrich)-28 g.
3. Polyurethane resin (SANCURE® 2104, BF Goodrich)-25 g.

The adhesive layer was dried and had 6 $g/m^2$ dry thickness.

For imagewise exposure, the above element was laminated, using heat and pressure to a four-color PRESSMATCH® Dry Negative proof, available from Agfa, prepared as described in U.S. Pat. No. 5,300,399. After a 30 second exposure to actinic light through a Stouffer step-wedge (0.15 incremental density increase per step) and peel development revealed a negative glossy image against a slightly matte background.

EXAMPLE 2

Another negative-working multilayer spot gloss element was prepared as follows:

On a 2 mil sheet of PET the following solution was coated with the aid of #12 Meyer rod:

1. Methyl ethyl ketone-47 g
2. Methoxy propanol-47 g
3. Poly-p-hydroxy styrene (12,000 MW, Maruzen)-10 g
4. Melamine-formaldehyde resin (CYMEL® 303, Cytec)-2 g
5. p-Toluenesulfonic acid-1 g.

The layer was crosslinked in the oven at 100° C. for 2 minutes. The dry weight was 1 g/m$^2$.

On this crosslinked layer, a spot gloss solution was coated with the aid of #12 Meyer rod:

1. Methoxy propanol-53 g
2. Methyl ethyl ketone-13 g
3. Diacetone alcohol-20 g
4. FORMVAR® 12/85 polyvinyl formal resin, Monsanto-3.0 g
5. Silica particles (AEROSIL® OX-50, Degussa)-0.2 g The gloss layer was dried in the oven at 100° C. for 1 minute.

On this gloss layer, a photoadhering layer solution was coated with the aid of #24 Meyer rod:

1. n-Butyl acetate-50 g
2. Polymer containing methacrylate groups (U.S. Pat. No. 5,300,399, Example 1)-10 g
3. Dipentaerythritol pentaacrylate (SARTOMER® 399, Sartomer Co)-4 g
4. 2-biphenylyl-4,6-bis-trichloromethyl-s-triazine-0.6 g The layer had 4 g/m$^2$ dry thickness.

On this photoadhering layer, an adhesive solution was coated with the aid of #20 Meyer rod:

1. Water-44 g
2. Acrylic resin (CARBOSET® 511, BF Goodrich)-28 g
3. Polyurethane resin (SANCURE® 2104, BF Goodrich)-25 g.

The adhesive layer was dried and had 6 g/m$^2$ dry thickness. For imagewise exposure, the above element was laminated, using heat and pressure to a four-color, PRESSMATCH® Dry Negative proof, available from Agfa, prepared as described in U.S. Pat. No. 5,300,399. After a 30 second exposure to actinic light through a Stouffer stepwedge (0.15 incremental density increase per step) and peel development revealed a negative glossy image against a slightly matte background.

EXAMPLE 3

A negative-working multilayer spot gloss element was prepared as follows:

On a 2 mil sheet of PET the following solution was coated with the aid of #12 Meyer rod:

1. Methyl ethyl ketone-47 g
2. Methoxy propanol-47 g
3. Poly-p-hydroxy styrene (12,000 MW, Maruzen)-10 g
4. Melamine-formaldehyde resin (Cymel 303, Cytec)-2 g
5. p-Toluenesulfonic acid-1 g.

The layer was crosslinked in the oven at 100° C. for 2 minutes. The dry weight was 1 g/m$^2$.

On this crosslinked layer, a spot gloss solution was coated with the aid of #12 Meyer rod:

1. Methoxy propanol-53 g
2. Methyl ethyl ketone-13 g
3. Diacetone alcohol-20 g
4. Formvar 12/85 polyvinyl formal resin, Monsanto-3.0 g
5. PMMA beads (U.S. Pat. No. 4,885,225)-0.2 g The beads were placed in the solution and coated immediately to prevent a solvent attack on PMMA. The gloss layer was dried in the oven at 100° C. for 1 minute.

On this gloss layer, a photoadhering layer solution was coated with the aid of #24 Meyer rod:

1. n-Butyl acetate-50 g
2. Polymer containing methacrylate groups (U.S. Pat. No. 5,300,399, Example 1)-10 g
3. Dipentaerythritol pentaacrylate (Sartomer 399, Sartomer Co)-4 g
4. 2-biphenylyl-4,6-bis-trichloromethyl-s-triazine-0.6 g The layer had 4 g/m$^2$ dry thickness.

On this photoadhering layer, an adhesive solution was coated with the aid of #20 Meyer rod:

1. Water-44 g
2. Acrylic resin (Carboset 511, BF Goodrich)-28 g
3. Polyurethane resin (Sancure 2104, BF Goodrich)-25 g.

The adhesive layer was dried and had 6 g/m$^2$ dry thick. For imagewise exposure, the above element was laminated, using heat and pressure to a four-color Pressmatch Dry Negative proof, available from Agfa, prepared as described in U.S. Pat. No. 5,300,399. After a 30 second exposure to actinic light through a Stouffer stepwedge (0.15 incremental density increase per step) and peel development revealed a negative glossy image against a slightly matte background.

What is claimed is:

1. A spot gloss film which comprises, in order from top to bottom:
   (i) a strippable, transparent cover sheet;
   (ii) a crosslinked layer, which comprises a polymer having phenolic groups;
   (iii) a translucent gloss layer, which comprises an organic binder, a polymerizable component comprising an ethylenically unsaturated monomer, polymer or oligoimer having at least one unsaturated group, a particulate material comprising silica, plastic beads, hollow spheres or mixtures thereof, and optionally, a photoinitiator, wherein the binder is present in sufficient amount to bind the gloss layer components into a uniform film, wherein the optional photoinitiator, when present, is present in sufficient amount to initiate polymerization of the polymerizable component, wherein the polymerizable component is present in sufficient amount to provide image differentiation when the film is imagewise exposed to actinic radiation, and wherein the particulate material is present in an amount sufficient to form a uniform suspension of the particulate material in the gloss layer;
   (iv) a photoadhering layer, which comprises a polymerizable component comprising an ethylenically unsaturated monomer, polymer or oligomer having at least one unsaturated group; a binder; and an optional photoinitiator, wherein the optional photoinitiator, when present, is present in sufficient amount to initiate polymerization of the polymerizable component; and wherein at least one of the gloss layer and the photoadhering layer contains a photoinitiator; and
   (v) a thermoplastic adhesive layer.

2. The film of claim 1 wherein the particulate material has an average diameter of from about 0.1 to about 1 micrometer.

3. The film of claim 1 wherein the particulate material has an average diameter of from about 0.2 to about 0.8 micrometers.

4. The film of claim 1 wherein the particulate material has an average diameter of from about 0.3 to about 0.6 micrometers.

5. The film of claim 1 wherein the particulate material comprises silica, polymethyl methacrylate, a styrene acrylate copolymer, or mixtures thereof.

6. The film of claim 1 wherein the photoadhering layer further comprises a polymer comprising polyvinyl acetal and polyvinyl alcohol segments, having from about 1 to about 40 weight % polyvinyl alcohol content.

7. The film of claim 1 wherein both the gloss layer and the photoadhering layer contain a photoinitiator.

8. The film of claim 1, wherein the ethylenically unsaturated polymerizable component is delivered to the gloss layer by interlayer diffuision during assembly of the film.

9. The film of claim 1 wherein the polymerizable component in (iii) and (iv) may be the same or different, each polymerizable component comprising one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylatc, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, diacrylate bisphenol A diepoxide dimethacrylate and bisphenol A.

10. The film of claim 1 wherein the photoinitiator comprises one or more photoinitiators selected from the group consisting of 2,3-di(4-methoxyphenyl)quinoxaline, 9-phenylacridine, 2-biphenyl-4,6-bis-trichloromethyl-5-triazine, bis(2,4,5-triphenyl)imidazole, bis-trichloromethyl-s-triazine, acetophenones, thioxanthones, acyl phosphine oxides, and their derivatives.

11. The film of claim 1 wherein the gloss layer comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

12. A method for producing a gloss-coated colored image which comprises:
A) providing a spot gloss film which comprises, in order from top to bottom:
(i) a strippable, transparent cover sheet;
(ii) a crosslinked layer, which comprises a polymer having phenolic groups;
(iii) a translucent gloss layer, which comprises an organic binder, a polymerizable component comprising an ethylenically unsaturated monomer, polymer or oligomer having at least one unsaturated group, a particulate material comprising silica, plastic beads, hollow spheres or mixtures thereof, and optionally, a photoinitiator, wherein the binder is present in sufficient amount to bind the gloss layer components into a uniform film, wherein the optional photoinitiator, when present, is present in sufficient amount to initiate polymerization of the polymerizable component, wherein the polymerizable component is present in sufficient amount to provide image differentiation when the film is imagewise exposed to actinic radiation, and wherein the particulate material is present in an amount sufficient to form a uniform suspension of the particulate material in the gloss layer;
(iv) a photoadhering layer, which comprises a polymerizable component comprising an ethylenically unsaturated monomer, polymer or oligomer having at least one unsaturated group; a binder; and an optional photoinitiator, wherein the optional photoinitialor, when present, is present in sufficient amount to initiate polymerization of the polymnerizable component; and wherein at least one of the gloss layer and the photoadhering layer contains a photoinitiator; and
(v) a thermoplastic adhesive layer;
B) laminating the spot gloss film to an image bearing receiver sheet;
C) imagewise exposing the gloss layer and the photoadhering layer to actinic radiation through the transparent cover sheet and crosslinked phenolic layer; and
D) peeling apart the image bearing receiver sheet and the transparent cover sheet, thereby leaving the crosslinked phenolic layer and the unexposed areas of the gloss layer attached to the cover sheet, while the exposed areas of the gloss layer and the unexposed areas of the photoadhering layer and the adhesive layer remain attached to the image bearing receiver sheet.

13. The method of claim 12 further comprising the subsequent step of post exposing the exposed areas of the gloss layer and the unexposed areas of the photoadhering layer remaining attached to the image bearing receiver sheet.

14. The method of claim 12 wherein the particulate material has an average diameter of from about 0.1 to about 1 micrometer.

15. The method of claim 12 wherein the particulate material has an average diameter of from about 0.2 to about 0.8 micrometers.

16. The method of claim 12 wherein the particulate material has an average diameter of from about 0.3 to about 0.6 micrometers.

17. The method of claim 12 wherein the particulate material comprises silica, polymethyl methacrylate, a styrene acrylate copolymer and mixtures thereof.

18. The method of claim 12 wherein the photoadhering layer further comprises a polymer comprising polyvinyl acetal and polyvinyl alcohol segments, having from about 1 to about 40 weight % polyvinyl alcohol content.

19. The method of claim 12 wherein both the gloss layer and the photoadhering layer contain a photoinitiator.

20. The method of claim 12, wherein the ethylenically unsaturated polymerizable component is delivered to the gloss layer by interlayer diffusion during assembly of the film.

21. The method of claim 12 wherein the polymerizable component comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, diacrylate bisphenol A diepoxide dimethacrylate, and bisphenol A.

22. The method of claim 12 wherein the photoinitiator comprises one or more photoinitiators selected from the group consisting of 2,3-di(4-methoxyphenyl)quinoxaline, 9-phenylacridine, 2-biphenyl-4,6-bis-trichloromethyl-5-triazine, bis(2,4,5-triphenyl)imidazole, bis-trichloromethyl-s-triazine, acetophenones, thioxanthones, acyl phosphine oxides, and their derivatives.

23. The method of claim 12 wherein the gloss layer comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

24. The method of claim 12 wherein the receiver sheet comprises paper, coated paper, or a polymeric film.

25. A method for producing a gloss film which comprises:
   (i) applying a crosslinked layer which comprises a polymer having phenolic groups, to a surface of a strippable, transparent cover sheet;
   (ii) applying a translucent gloss layer onto the crosslinked layer, which gloss layer comprises an organic binder, a polymerizable component comprising an ethylenically unsaturated monomer, polymer or oligomer having at least one unsaturated group, a particulate material comprising silica, plastic beads, hollow spheres or mixtures thereof, and optionally, a pholoinitiator, wherein the binder is present in sufficient amount to bind the gloss layer components into a uniform film, wherein the optional photoinitiator, when present, is present in sufficient amount to initiate polymerization of the polymerizable component, wherein the polymerizable component is present in sufficient amount to provide image differentiation when the film is imagewise exposed to actinic radiation, and wherein the particulate material is present in an amount sufficient to form a uniform suspension of the particulate material in the gloss layer;
   (iii) applying a photoadhering layer onto the gloss layer, which photoadhering layer comprises a polymerizable component comprising an ethylenically unsaturated monomer, polymer or oligomer having at least one unsaturated group; a binder and a photoinitiator, wherein the photoinitiator is present in sufficient amount to initiate polymerization of the polymerizable component; and causing the polymerizable component and photoinitiator to diffuse into the gloss layer; and
   (iv) applying a thermoplastic adhesive layer onto the photoadhering layer.

26. The method of claim 25 wherein the photoadhering layer further comprises a polymer comprising polyvinyl acetal and polyvinyl alcohol segments and having from about 1 to about 40 weight % polyvinyl alcohol content.

* * * * *